United States Patent
Maiz et al.

(10) Patent No.: US 8,368,171 B2
(45) Date of Patent: Feb. 5, 2013

(54) METHODS OF FORMING ELECTROMIGRATION AND THERMAL GRADIENT BASED FUSE STRUCTURES

(75) Inventors: Jose A. Maiz, Portland, OR (US); Jun He, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 634 days.

(21) Appl. No.: 11/605,119

(22) Filed: Nov. 27, 2006

(65) Prior Publication Data

US 2007/0069331 A1    Mar. 29, 2007

Related U.S. Application Data

(62) Division of application No. 11/133,835, filed on May 20, 2005.

(51) Int. Cl.
*H01L 23/52* (2006.01)
*H01L 29/40* (2006.01)

(52) U.S. Cl. .......... 257/529; 257/758; 257/751
(58) Field of Classification Search .......... 257/528–535, 257/E21.003
See application file for complete search history.

(56) References Cited

U.S. PATENT DOCUMENTS

| | | | |
|---|---|---|---|
| 6,111,301 A * | 8/2000 | Stamper | 257/529 |
| 6,617,664 B2 * | 9/2003 | Hayashi et al. | 257/529 |
| 6,911,360 B2 * | 6/2005 | Li et al. | 438/238 |
| 7,298,639 B2 | 11/2007 | Hsu et al. | |
| 2004/0262768 A1 | 12/2004 | Cho et al. | |
| 2005/0001241 A1 | 1/2005 | Doyle | |

* cited by examiner

*Primary Examiner* — Cuong Q Nguyen
(74) *Attorney, Agent, or Firm* — Forefront IP Lawgroup, PLLC

(57) ABSTRACT

Methods of forming a microelectronic structure are described. Embodiments of those methods include forming a metallic fuse structure by forming at least one via on a first interconnect structure, lining the at least one via with a barrier layer, and then forming a second interconnect structure on the at least one via.

7 Claims, 13 Drawing Sheets

METHODS OF FORMING ELECTROMIGRATION AND THERMAL GRADIENT BASED FUSE STRUCTURES

This U.S. patent application is a divisional of U.S. patent application Ser. No. 11/133,835 filed May 20, 2005.

BACKGROUND OF THE INVENTION

The use of fuses in microelectronic circuits is widespread. Fuses may provide a convenient way of encoding information permanently in a device, such as for purposes of redundancy, unit identification, providing allowed operating ranges, for example. Fuses can also be used to adjust the speed of a circuit by adjusting the resistance of the current path, for example. As the complexity and density of microelectronic devices increases, the number of individual fuses incorporated within each device will likely increase.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
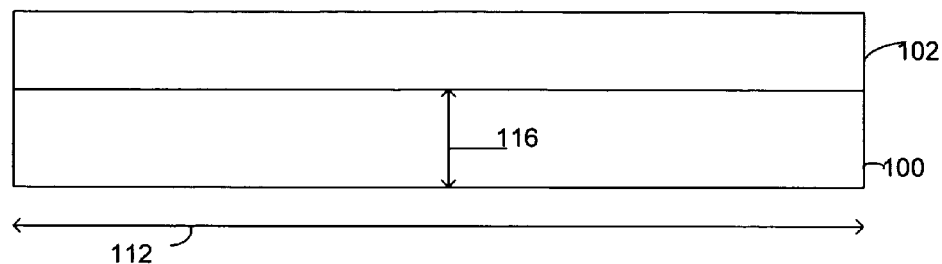
FIGS. 1a-1j represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a metallic fuse structure, are described. Those methods may comprise forming a metallic fuse structure by forming at least one via on a first interconnect structure, lining the at least one via with a barrier layer, and then forming a second interconnect structure on the at least one via.

FIGS. 1a-1i illustrate an embodiment of a method of forming a microelectronic structure, such as a metallic fuse structure, for example. FIG. 1a illustrates a cross sectional view of a first interconnect structure 100. The first interconnect structure 100 may comprise any conductive structure that may reside within a microelectronic device, such as but not limited to a copper and/or an aluminum interconnect structure, for example. In one embodiment, the first interconnect structure 100 may comprise a metal layer in a portion of an integrated circuit, such as but not limited to a metal interconnect structure. In one embodiment, the first interconnect structure 100 may comprise a metal gate material, such as but not limited to hafnium, zirconium, titanium, tantalum, aluminum, copper, platinum, palladium, nickel, cobalt, and ruthenium or combinations thereof, for example. In one embodiment, the first interconnect structure 100 may comprise a length 112 and a height 116.

Figure 1B:
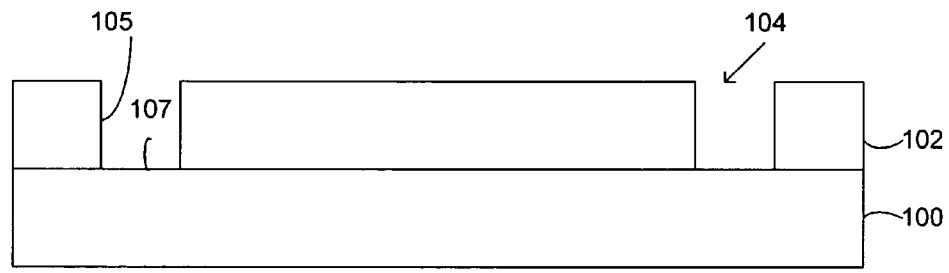
Figure 1C:
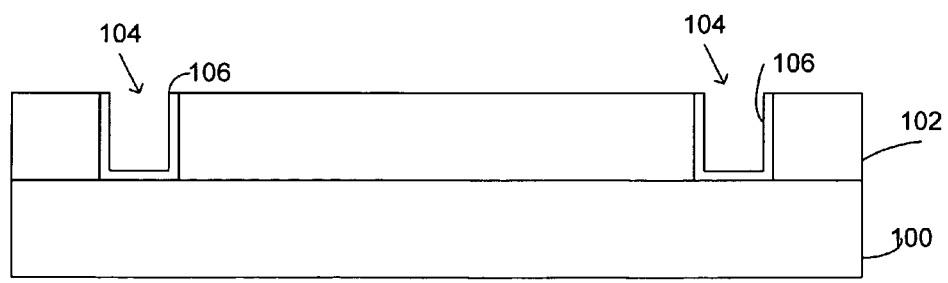

A dielectric layer 102 may be formed on the first interconnect structure 100 (FIG. 1b). In one embodiment, the dielectric layer 102 may comprise a low k dielectric layer, wherein the dielectric constant of the dielectric layer 102 may be below about 4. At least one opening 104 may be formed in the dielectric layer 102, using methods well known in the art. The at least one opening 104 may comprise at least one sidewall 105 and a bottom surface 107. In one embodiment, the at least one opening 104 may be lined with a barrier layer 106 (FIG. 1c). The barrier layer 106 may be formed (i.e. may line) the at least one sidewall 105 and the bottom surface 107 of the at least one opening 104.

Figure 1D:
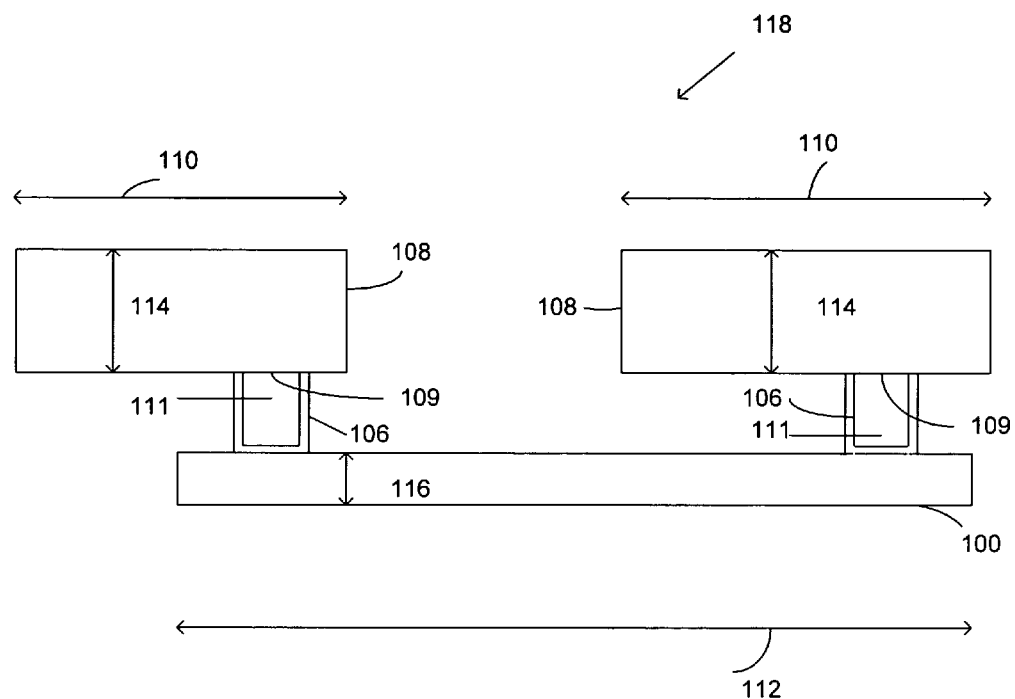

In one embodiment, the barrier layer 106 may comprise at least one of titanium, titanium nitride, tantalum, tantalum nitride and ruthenium. It will be understood by those skilled in the art that the at least one opening 104 may in some embodiments be filled with a conductive material during a subsequent process step (not shown) to form at least one via 111 (FIG. 1d). In one embodiment, the at least one via 111 may comprise copper and/or tungsten.

The at least one via 111 may comprise in some embodiments a top surface 109 that may not comprise the barrier layer 106. In one embodiment, the barrier layer 106 may be disposed on the first interconnect structure 100. In one embodiment, the at least one via 111 may comprise a length of about 10 microns or less, but in general the length of the at least one via will depend upon the particular application.

A second interconnect structure 108 may be formed on the top surface 109 of the at least one via 111 to form a metallic fuse structure 118. The second interconnect structure 108 may comprise a conductive layer, and in some embodiments may comprise a metal layer, such as copper for example. In one embodiment, the second interconnect structure 108 may comprise a metal layer in a portion of a microelectronic device, such as but not limited to a metal interconnect structure in an integrated circuit. In one embodiment, the second interconnect structure 108 may comprise a length 110 and a height 114. In one embodiment, the metallic fuse structure 118 may comprise little to no silicide material, and may comprise at least one of copper and aluminum, for example.

In one embodiment, the length 112 of the first interconnect structure 100 and the length 110 of the second interconnect structure 108 may be at least about 1.5 times greater than a critical length for electromigration and/or a thermal decay length of the first and the second interconnect structures 100, 108, respectively. The critical length for electromigration of the first and the second interconnect structures 100, 108 may correspond to the length below which mass transport of atoms comprising the first and the second interconnect structures 100, 108 may appreciably vanish in response to an electron wind, as is well known in the art, that may be caused by electromigration (i.e. momentum transfer wherein electrons push atoms in the direction of the electron wind) for example. In addition, the thermal decay length may correspond to a reasonable length for which to maintain a thermal gradient within metallic fuse structure 118, as will be described in greater detail below. It will be understood by those skilled in the art that the thermal decay length will vary depending upon the type of conductive material comprising the first and second interconnect structures 100, 108.

In general, the cross sectional areas of the first and the second interconnect structures 100, 108 may be such that one interconnect structure may comprise a greater cross sectional area than the other in order to enhance a current density gradient, and also a thermal gradient between the two interconnect structures. It will be understood by those skilled in the art that the cross sectional areas of the first and second interconnect structures 100, 108 may be geometrically optimized such that the current density gradient between them may enhance an electromigration and/or a temperature gradient effect when a current may be applied to the metallic fuse structure 118. In one embodiment, a width 121 of the second interconnect structure 108 may be at least about 1.5 times wider than a width 115 of the first interconnect structure 100 (top view of metallic fuse structure 118, FIG. 1*j*).

Figure 1E:
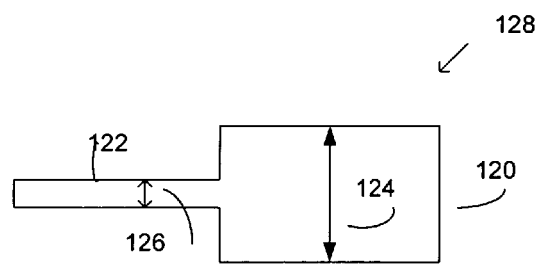

FIG. 1*e* depicts a top view of a metallic fuse structure 128 that may comprise a first portion 120 and a second portion 122, according to another embodiment of the present invention. The first portion 120 may comprise a width 124 and the second portion 122 may comprise a width 126. In general, the first portion 120 may comprise a width 124 that may be at least about 3 times greater than the width 126 of the second portion 122. The metallic fuse structure 128 may comprise a conductive material, such as but not limited to copper.

In one embodiment the first portion 120 and the second portion 122 of the metallic fuse structure 128 may substantially comprise the same composition of materials. For example, the first portion 120 and the second portion 122 may both comprise a conductive material such as copper, for example. In one embodiment the first portion 120 and the second portion 122 of the metallic fuse structure 128 may comprise little to no silicide material. In one embodiment, the metallic fuse structure 128 may comprise an interconnect structure in a microelectronic device, such as an integrated circuit, for example.

Figure 1F:
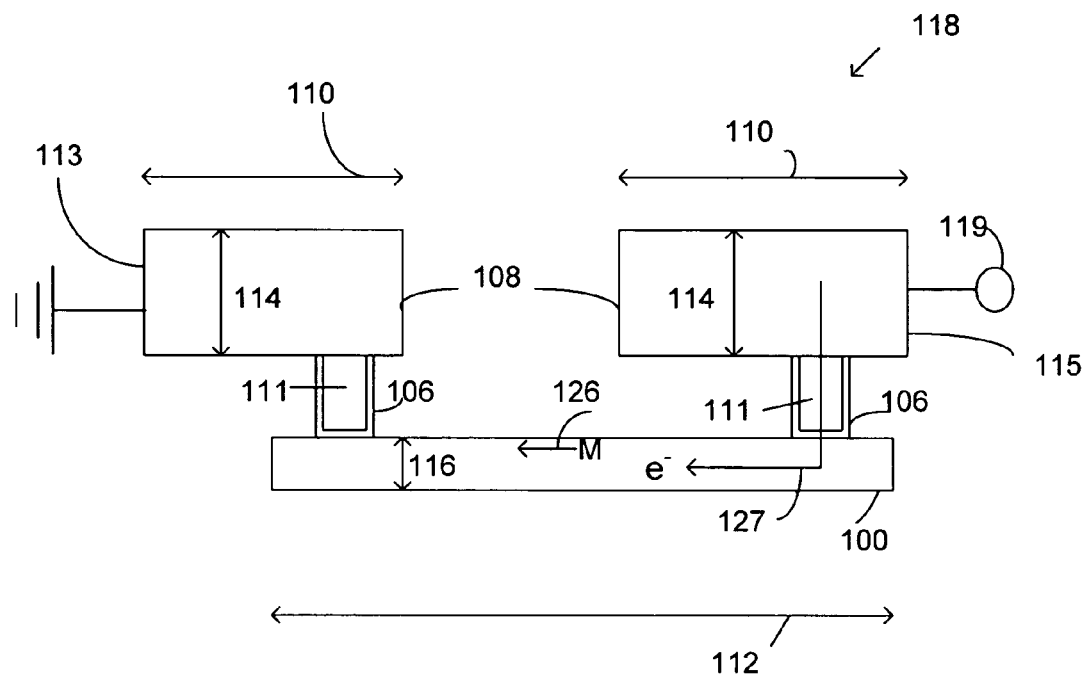
Figure 1G:
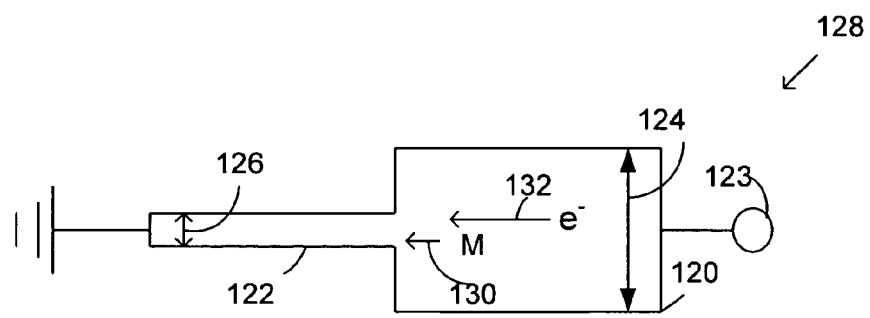

FIG. 1*f* depicts a cross sectional view wherein a current source 119 is coupled to the metallic fuse structure 118. The current source 119 may be adapted to supply a sufficient amount of current to initiate electromigration and/or a temperature gradient within the metallic fuse structure 118, as a potential is applied across the metallic fuse structure 118. In one embodiment, the current may be applied in order to program the metallic fuse structure 118, for example by changing the resistance of the metallic fuse structure 118 from an initial (before the application of current) resistance value to a second (after current is applied) resistance value. In another embodiment, the amount of current supplied may be sufficient to induce a temperature gradient within the metallic fuse structure 118 that may result (either alone or in combination with the electromigration effect) in the creation of at least one void 134 within the metallic fuse structure 118.

In one embodiment, the resistance may be measured between one point and another point of the metallic fuse structure 118. For example, by illustration and not limitation, the resistance may be measured between one end point 113 of the metallic fuse structure and another end point 115 located at an opposite side of the metallic fuse structure 118. In general, the points at which the reading and/or measurement of the resistance of the metallic fuse structure 118 will depend upon the particular application. Additionally, it will be understood that the metallic fuse structure 118 may be coupled to the current source in any type of circuit configuration, according to the particular application, and may in some embodiments by coupled to the current source in a fuse bank circuit, as is well known in the art, for example.

In one embodiment, the electron wind 127 (or flow) of the electromigration phenomenon may provide one mechanism by which the mass transport of atoms 126 from the first and the second interconnect structures 100, 108 may occur in the direction of the electron wind 127. The magnitude of the current supplied may depend upon the particular application, but in general may be of a magnitude such that electromigration is enabled, but low enough so that the conductive material comprising the first and the second interconnect structures 100, 108 does not reach a temperature substantially near and/or above the melting point of the conductive material.

Figure 1H:
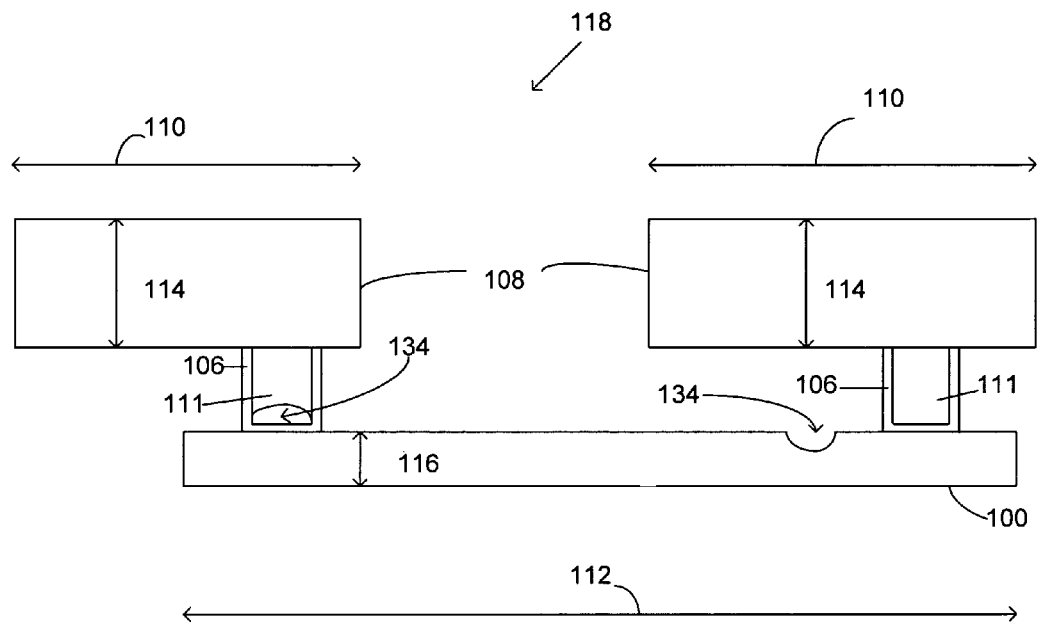

FIG. 1*h* depicts the metallic fuse structure 118 after an amount of current has been supplied. In one embodiment, the barrier layer 106 disposed on the first interconnect structure 100 may provide a flux divergence. For example, the atoms in a portion of the first interconnect structure 100 may not be substantially replenished as they migrate from the first interconnect structure 100 to the at least one via 111 and/or the atoms from the at least one via may not be replenished as they move from the at least one via 111 towards the second interconnect structure 108.

In one embodiment, the flux divergence caused by the barrier layer 106 disposed on the first interconnect structure 100 may enhance the formation of the least one void 134. In one embodiment, the at least one void 134 may be formed in a portion of the metallic fuse structure 118 as a result of the current induced electromigration. In one embodiment, the at least one void 134 may form in a portion of the first interconnect structure 100 and/or in a portion of the at least one via 111 of the metallic fuse structure 118. In one embodiment, the utilization of the barrier layer 106 may greatly enhance the reliability and repeatability of the programming of the metallic fuse structure 118, since the at least one void 134 may be formed substantially near the barrier layer 106. In one embodiment, the at least one void 134 may not substantially form within the barrier layer 106 of the at least one via 111.

In addition, since the amount of current supplied to the metallic fuse structure 118 may be such that it may be approximately below the melting points of the first and the second interconnect structures 100, 108 and the at least one via 111, the first and second interconnect structures 100, 108 and the at least one via 111 may remain substantially intact. In other words, in some embodiments, the at least one void 134 may result in little damage to the surrounding materials within the metallic fuse structure 118. For example, in some embodiments, a dielectric layer that may surround the metallic fuse structure 118 (not shown), such as a low k interlayer dielectric (ILD) for example, may benefit by the at least one void 134 not creating substantial damage within the low k ILD.

For example, since the at least one void 134 does not result in as severe topology as a complete rupture of the metallic fuse structure 118, the surrounding dielectric layer may remain substantially unaffected by the topography of the at least one void 134, and therefore fabrication yields and device reliability may be enhanced. It will be understood by those skilled in the art that the amount of current supplied will vary depending upon the particular application.

In one embodiment, the at least one void 134 may correspond to a region of higher resistance in the metallic fuse structure 118. In this manner, the metallic fuse structure 118 may be programmed, i.e., the metallic fuse structure 118 or a portion of the metallic fuse structure may comprise a first resistance value that may be increased to a second resistance value by the creation of the at least one void 134 in the metallic fuse structure 118. In some embodiments, the metallic fuse structure 118 may be programmed by utilizing a low voltage, since the amount of voltage necessary to program the metallic fuse structure 118 may be such that voids may be created either by electromigration and/or a temperature gradient mechanism, but low enough so that the metallic fuse structure 118 does not reach a temperature substantially near and/or above the melting temperature of the metallic fuse structure materials. In one embodiment, the metallic fuse structure 118 may be programmed near about one volt or below.

Figure 1I:
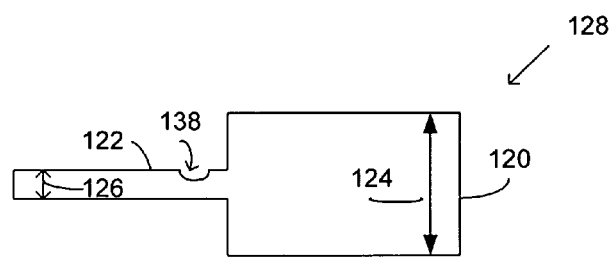
Figure 1J:
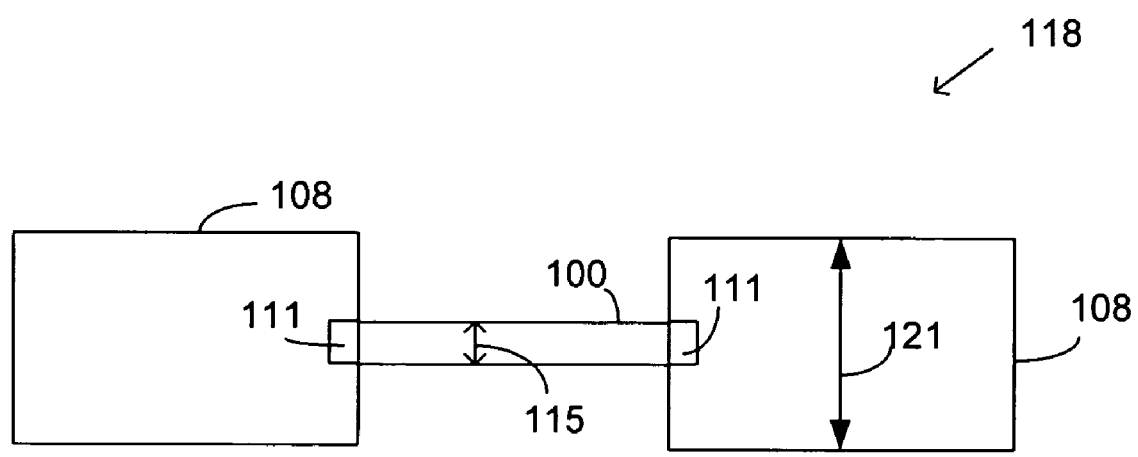

In one embodiment, the width 121 of the second interconnect structure 108 may be greater than about 1.5 times the width 115 of the first interconnect structure 100 (see FIG. 1j). In this manner, the current density (as a programming voltage is applied across the metallic fuse structure 118) may be greater within the first interconnect structure 100 than in the second interconnect structure 108.

In one embodiment, electromigration may be enhanced within the first interconnect structure 100 due to the greater current density within the first interconnect structure 100. This enhanced electromigration may then result in the at least one void 134 forming within the first interconnect structure 100 and/or in the at least one via 111, since the conductive atoms of the first interconnect structure 100 may move more quickly through the first interconnect structure 100 than through the second interconnect structure 108, and may leave a void behind as they move through the first interconnect structure 100.

In addition, in some embodiments, because of the current density gradient between the first interconnect structure 100 and the second interconnect structure 108, there may be a thermal gradient between the first interconnect structure 100 and the second interconnect structure 108. The thermal gradient, either alone or in combination with electromigration, may then result in the at least one void 134 forming within the first interconnect structure 100 and/or the at least one via 134, since the conductive atoms of the first interconnect structure 100 may move more quickly through the first interconnect structure 100 than through the second interconnect structure 108 due to the hotter temperature within the narrower first interconnect structure 100. Thus, by optimizing the geometries of the first and the second interconnect structures 100, 108, the overall resistance of the metallic fuse structure 118 may be lowered, as well as the programming voltage required to program the metallic fuse structure 118.

Referring back to FIG. 1g, a current source 123 may be coupled to the metallic fuse structure 128. The current source 123 may be adapted to supply a sufficient amount of current to initiate electromigration and/or a temperature gradient within the metallic fuse structure 128. The magnitude of the current supplied may depend upon the particular application, but in general may be of a magnitude such that electromigration and/or a temperature gradient is enabled, but low enough so that the conductive material comprising the first and the second portions 120, 122 of the metallic fuse structure 128 does not reach a temperature substantially near the melting point of the conductive material. Thus, the metallic fuse structure 128 may be programmed at a relatively low voltage, and in some embodiments may be programmed near about one volt or below.

In one embodiment, the electromigration and/or the temperature gradient may cause a mass transport of atoms 130. Because the width 124 of the first portion 120 of the metallic fuse 128 is greater than the width 126 of the second portion 122 of the metallic fuse 128, there may be enhanced electromigration and/or a higher temperature within the second portion 122 as compared to the first portion 120 due to the greater current density in the second portion 122.

In one embodiment, because of the enhanced electromigration and/or temperature within the second portion 122, at least one void 138 may be formed in the metallic fuse structure 128 (FIG. 1i). In one embodiment, the at least one void 138 may be formed in the second portion 122. In one embodiment, a region of the metallic fuse structure 128 surrounding the at least one void 138 may remain substantially intact, i.e., there may be little to no structural damage near the region of the metallic fuse structure 128 surrounding the at least one void 138.

Figure 2A:
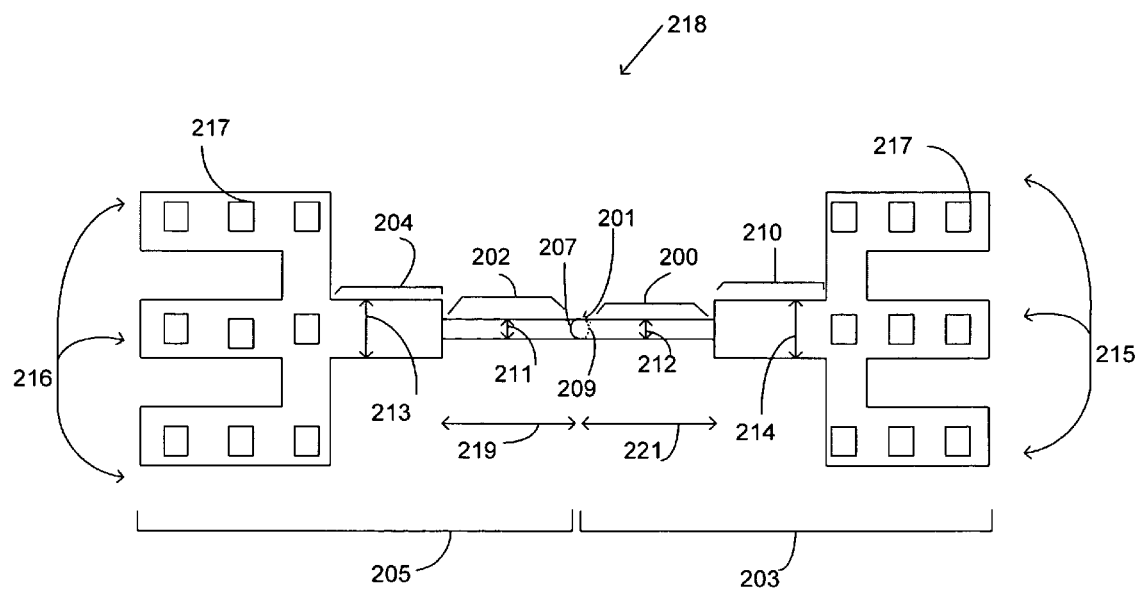
FIGS. 2a-2c represent structures according to an embodiment of the present invention.

FIG. 2a depicts a top view of a metallic fuse structure 218 according to an embodiment of the present invention. In one embodiment, the metallic fuse structure 218 may comprise a via 201, wherein a top surface 207 of the via 201 may be attached to a first portion 202 of a first interconnect structure 205 and a bottom surface 209 of the via 201 may be attached to a first portion 200 of a second interconnect structure 203. In one embodiment, the first and the second interconnect structures 205, 203 may comprise a metallic material, such as copper, and may comprise little to no silicide. The via 201 may comprise a conductive material, such as copper in some embodiments. The via 201 may comprise a barrier liner (not shown), similar to the barrier liner 106 of the at least one via 111 of FIG. 1f. In one embodiment, the barrier liner may comprise at least one of titanium, tantalum, titanium nitride and tantalum nitride.

In one embodiment, a width 211 of the first portion 202 of the first interconnect structure 205 may be less than a width 213 of a second portion 204 of the first interconnect structure 205. In one embodiment, the width 213 of the second portion 204 may range between about 1.5 to about 4 times greater than the width 212 of the first portion 200 of the first interconnect structure 205. In one embodiment, a width 212 of the first portion 200 of the second interconnect structure 203 may be less than a width 214 of a second portion 210 of the second interconnect structure 203.

In one embodiment, the width 214 of the second portion 210 may range between about 1.5 to about 4 times greater than the width 212 of the first portion 200 of the second interconnect structure 203. Because in some embodiments the first portions 202, 200 may comprise a smaller width 211, 212 than the widths 213, 214 of the second portions 204, 210 of the metallic fuse structure 218, the first portions 202, 200 may comprise a greater current density and hence a greater electromigration effect and/or a higher temperature than the second portions 204, 210. It will be understood that the geometries for a particular application may be designed such that the current density gradient for a given design geometry may be optimized. For example, the heights of the second portions 204, 210 and the heights of the first portions 202, 200 of the metallic fuse structure 218 may be substantially the same, while the widths may be varied to optimize a desired current gradient.

By optimizing the geometries of the first and the second interconnect structures 205, 203, the overall resistance of the metallic fuse structure 218 may be lowered, as well as the programming voltage required to program the metallic fuse structure 218. In one embodiment, a length 219 of the first portion 202 of the first interconnect structure 205 and a length 221 of the first portion 200 of the second interconnect structure 203 may be at least about 1.5 times the thermal decay length of the first interconnect structure 205 and the second interconnect structure 203.

In one embodiment, the first interconnect structure 205 may be disposed above the second interconnect structure 203 (FIG. 2c, cross-sectional view), such as, for example, in the case of a second metal interconnect structure disposed above a first metal interconnect structure, as is well known in the art. In one embodiment, the via 201 (which in one embodiment may include a barrier layer 206) may provide a connection between the first interconnect structure 205 and the second interconnect structure 203.

In one embodiment, the second portion 204 of the first interconnect structure 205 may comprise a first plurality of reservoirs 216, and the second portion 210 of the second interconnect structure 203 may comprise a second plurality of reservoirs 215. The first plurality of reservoirs 216 and the second plurality of reservoirs 215 may comprise at least one contact 217. In one embodiment, the at least one contact 217 may be coupled to a current source (not shown), and a sufficient amount of current may be supplied to the metallic fuse structure 218 to induce electromigration and/or a temperature gradient within the metallic fuse structure 218 and thus the metallic fuse structure 218 may be programmed by the creation of at least one void (not shown) as described previously herein. In one embodiment, the amount of current supplied may be less than the melting temperature of the conductive material of the metallic fuse structure 218.

While electromigration may be enhanced (and/or the temperature may be increased) within the first portions 200, 212 of the metallic fuse structure 218, the first and second plurality of reservoirs 216, 215 may provide reservoirs for the migrating conductive material (which may comprise copper in one embodiment) of the metallic fuse structure 218 during electromigration. Thus, the plurality of reservoirs may provide a means to lower the overall resistance of the metallic fuse structure 218, which may then allow the programming voltage of the metallic fuse structure 218 to be lowered. In one embodiment, the programming voltage of the metallic fuse structure 218 may comprise about 1 volt or below, and the programming pulse time may comprise about 1 millisecond or below.

Figure 2B:
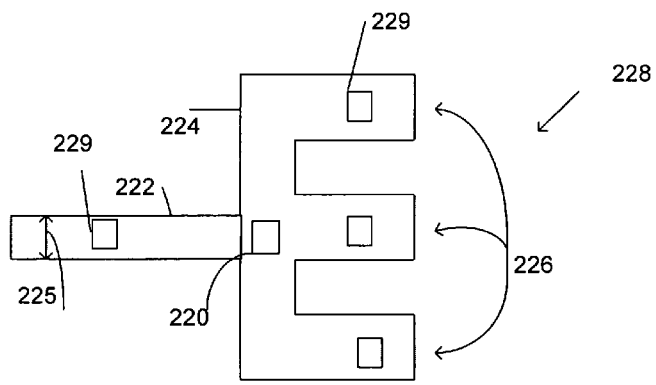
Figure 2C:
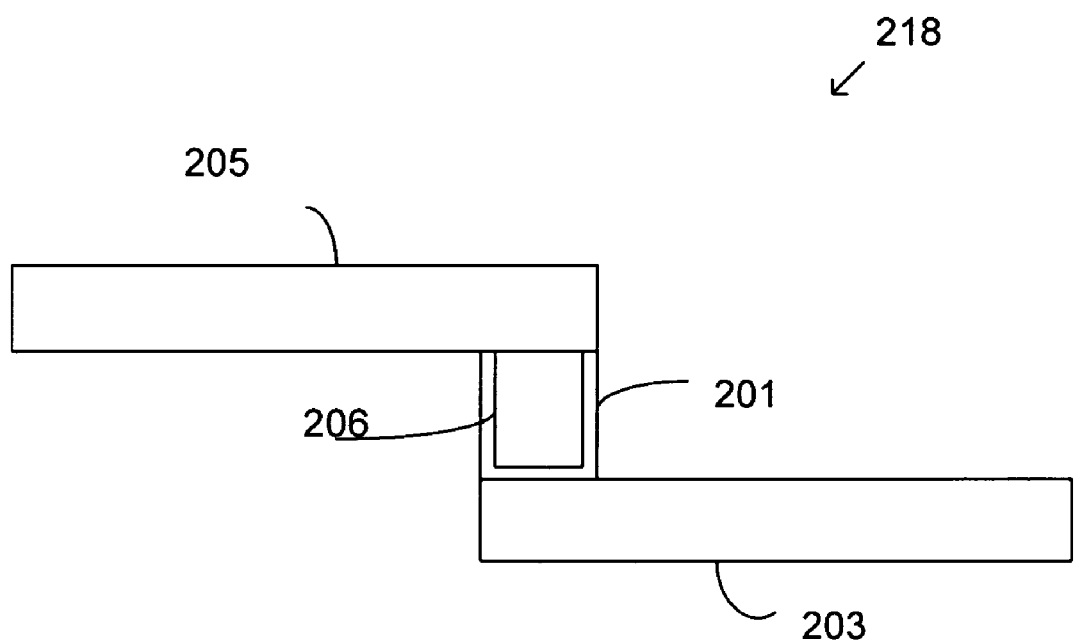

FIG. 2b depicts a top view of another embodiment of a fuse structure according to the present invention. A metallic fuse structure 228 may comprise a first interconnect structure 222 and a second interconnect structure 224 coupled by a via 220. In one embodiment, the first interconnect structure 222 and a second interconnect structure 224 may comprise a conductive material, such as but not limited to copper. In one embodiment, the metallic fuse structure 228 may comprise little to no silicide.

In one embodiment, the via 220 may comprise a barrier lining (not shown), similar to the barrier lining 106 of the at least one via 111 of FIG. 1f. In one embodiment, the first interconnect structure 222 may comprise a width 225. In one embodiment, the second interconnect structure 224 may comprise a plurality of reservoirs 226. The plurality of reservoirs 226 and the first interconnect structure 222 may comprise at least one contact 229.

The metallic fuse structure 228 may be coupled to a current source (not shown), and a sufficient amount of current may be supplied to the metallic fuse structure 228 to induce electromigration and/or a temperature gradient within the metallic fuse structure 228, and thus the metallic fuse structure 228 may be programmed by the creation of at least one void (not shown) as described previously herein. In one embodiment, the amount of current supplied may be less than the melting temperature of the conductive material of the metallic fuse structure 218. In one embodiment, the overall resistance of the metallic fuse structure 228 may be lowered by optimizing the number of reservoirs as well as by optimizing the geometry of the metallic fuse structure 228.

In one embodiment, the plurality of reservoirs 226 may provide reservoirs for the migrating conductive material (which may comprise copper in one embodiment) of the metallic fuse structure 218. In one embodiment, the metallic fuse structure 228 may comprise a temperature gradient between the plurality of reservoirs 226 and the narrower first interconnect structure 222, so that enhanced atom migration and thus void formation may occur within the metallic fuse structure 228, and hence lower programming voltage may be required to change the resistance of the metallic fuse structure 228.

Figure 5A:
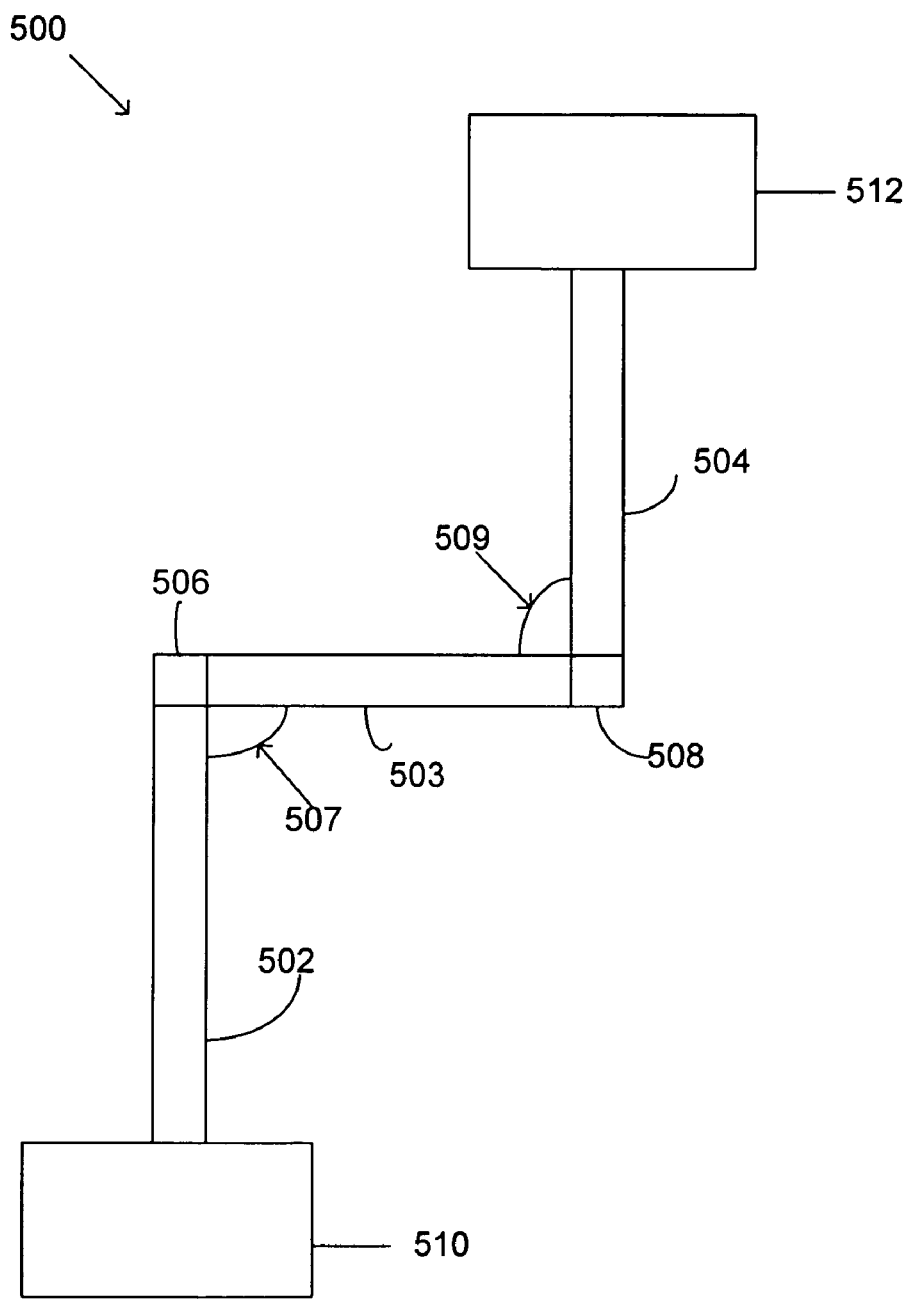
FIGS. 5a-5c represent structures according to an embodiment of the present invention.

FIG. 5a depicts a top view of a metallic fuse structure 500 according to another embodiment of the present invention. The metallic fuse structure 500 may comprise a first interconnect structure 502, a second interconnect structure 503 and a third interconnect structure 504. A first via 506 may couple the first and the second interconnect structures 502, 503, and a second via 508 may couple the second and third interconnect structures 503, 504. In one embodiment, the first interconnect structure 502 and the third interconnect structure 504 may be substantially within the same plane. For example, the first interconnect structure 502 and the third interconnect structure 504 may comprise one level of metallization, while the second interconnect structure 503 may comprise another level of metallization that may be disposed on another plane (i.e., above or below the first interconnect structure 502 and the third interconnect structure 504) within the device, as is well known in the art.

Figure 5B:
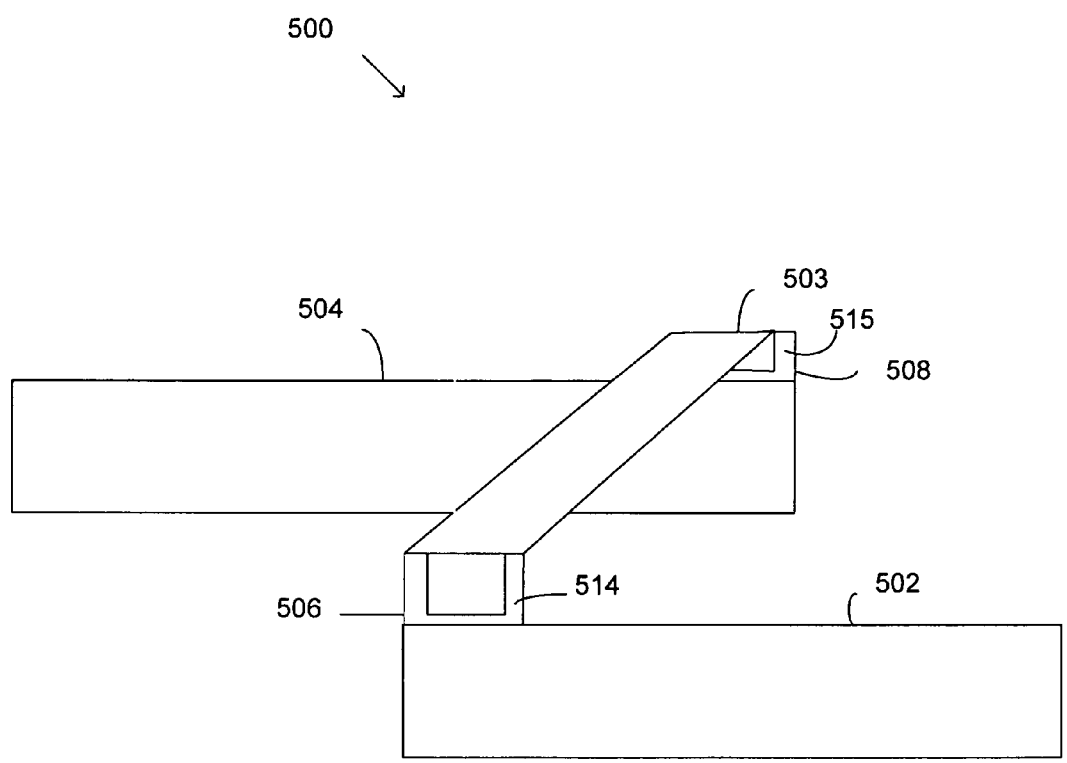

In one embodiment, the first and second vias 506, 508 may comprise a barrier layer 514, 515 respectively that may be disposed on the first and third interconnect structures 502, 504 respectively (FIG. 5b, cross-sectional view). In one embodiment, the barrier layer 514, 515 may comprise at least one of titanium, titanium nitride, tantalum and tantalum nitride. In one embodiment, the first, second and third interconnect structures 502, 503, 504 may comprise a conductive material, such as but not limited to copper. In one embodiment, the metallic fuse structure 500 may comprise little to no silicide.

Figure 5C:
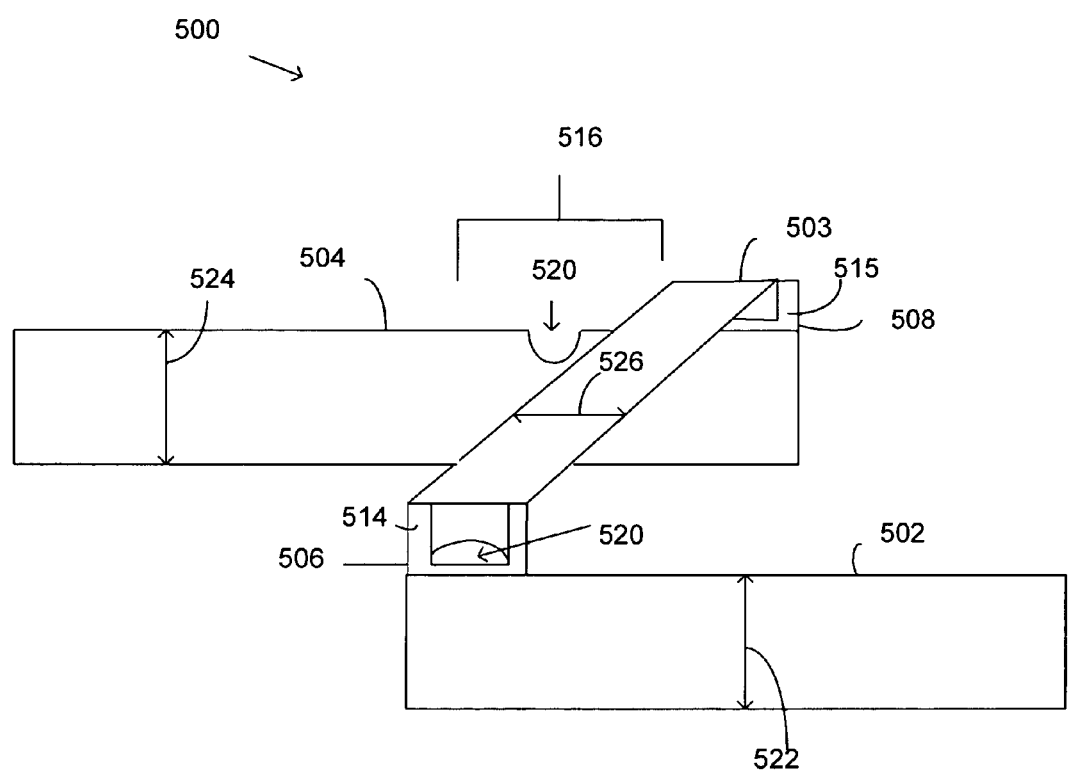

A current source (not shown) may be coupled to the metallic fuse structure 500. The current source may be adapted to supply a sufficient amount of current to initiate sufficient electromigration within the metallic fuse structure 500 and/or a sufficient temperature gradient between the first and the second interconnect structures 502, 503 and between the second and the third interconnect structure 503, 504 to create at least one void 520 (FIG. 5c).

The magnitude of the current supplied may depend upon the particular application, but in general may be of a magnitude such that electromigration and/or a temperature gradient is enabled and sufficient void 520 creation is attained for programming purposes, but low enough so that the conductive material comprising the metallic fuse structure 500 does not reach a temperature substantially near and/or above the melting point of the conductive material. In one embodiment, the at least one void 520 may be formed in a region 516 of the third interconnect structure 504 and/or in the first and/or second via 506, 508. The location of the at least one void 520 will depend upon the particular application, however.

Referring back to FIG. 5a, in one embodiment, a width 522 of the first interconnect structure 502 and/or a width 524 of the third interconnect structure 504 may be about at least 1.5 times a width of the second interconnect structure 503. In one embodiment, the temperature of the narrower second interconnect structure 503 as current is applied to the metallic fuse structure 500 may be greater than about 1.5 times than the temperature of the first and third interconnect structures 502, 504, thus enhancing atom migration and therefore void formation.

In one embodiment, an angle 507 between the first and second interconnect structures 502, 503 and an angle 509 between the second and third interconnect structures 503, 504 may be about 90 degrees. In another embodiment, the angles 507, 509 may range from about 80 to about 100 degrees. The angles 507, 509 may be optimized to enhance electromigration and/or a thermal gradient within the metallic fuse structure 500 according to the particular design, and in some embodiments may constitute any angle that may serve to optimize the available space within a particular device (i.e., the angles 507, 509 may be optimized to minimize the footprint of the metallic fuse structure 500 within a particular device). In one embodiment, the first interconnect structure 502 and the second interconnect structure 504 may comprise conductive contacts 510, 512 respectively that may electrically connect the metallic fuse structure 500 to other structures within/without the device, for example. In one embodiment, the metallic fuse structure 500 may be programmed at a relatively low voltage, and in some embodiments may be programmed near about one volt or below.

Figure 3:
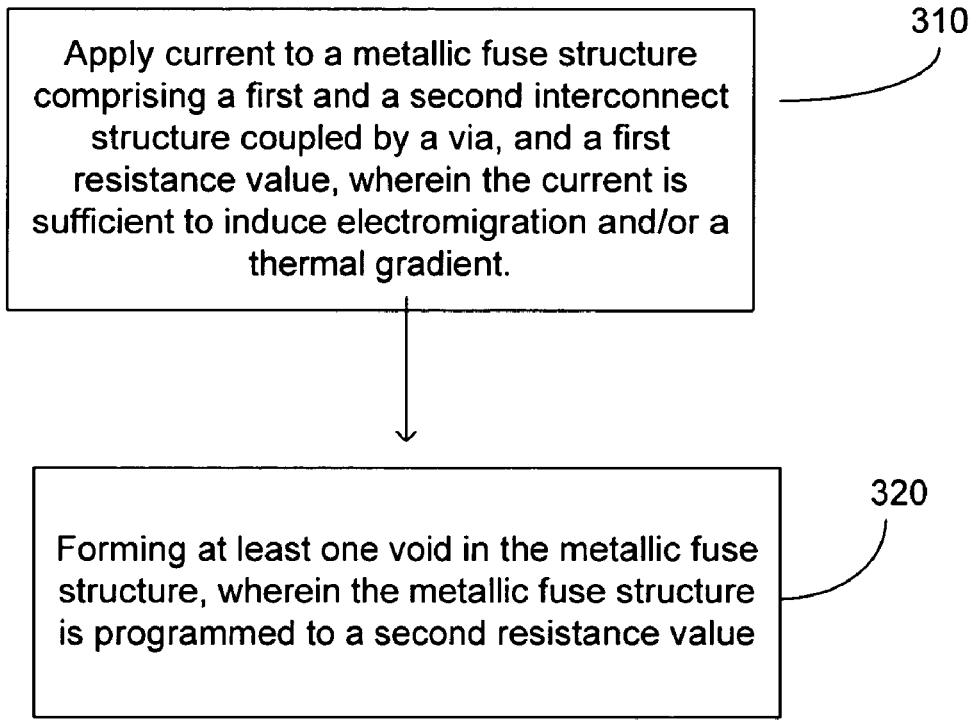
FIG. 3 represents a flow chart according to an embodiment of the present invention.

FIG. 3 depicts a flow chart of a method of programming a metallic fuse structure according to an embodiment of the present invention, such as the metallic fuse structure 118 and the metallic fuse structure 128, for example. At step 310, a current or voltage pulse is applied to a metallic fuse structure comprising a first and a second interconnect structure coupled by a via, and a first resistance value, wherein the current is sufficient to induce electromigration and/or a thermal gradient. In one embodiment, the current supplies an amount of heat that is approximately below the melting point of the metallic fuse structure.

At step 320, at least one void may be formed in the metallic fuse structure, wherein the metallic fuse structure is programmed to a second resistance value. In one embodiment, the at least one void does not create substantial damage within and/or around the metallic fuse structure. In one embodiment, the voltage applied to the metallic fuse structure may comprise about 1 volt, and the pulse time to program the metallic fuse structure may comprise about 1 millisecond.

Figure 4A:
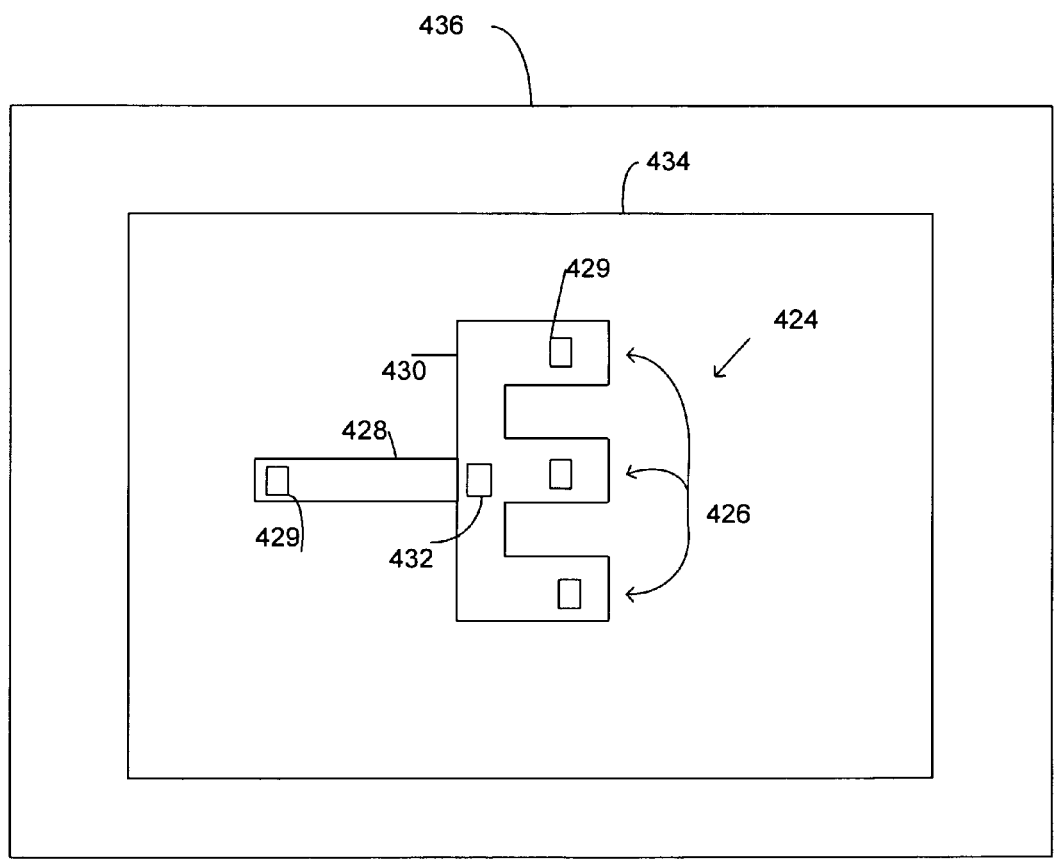
FIGS. 4a-4b represent a system according to an embodiment of the present invention.

FIG. 4a depicts a metallic fuse structure 424, similar to the metallic structure 218 of FIG. 2b, for example. The metallic fuse structure 424 may comprise a first interconnect structure 428 and a second interconnect structure 430, that may be coupled by a via 432. In one embodiment, the first interconnect structure 428 and the second interconnect structure 430 may comprise a conductive material, such as but not limited to copper. In one embodiment, the first interconnect structure 428 and the second interconnect structure 430 may comprise at least one contact 429 that may comprise a conductive material. In one embodiment, the second interconnect structure 430 may comprise a plurality of reservoirs 426. The via 432 may comprise a barrier lining (not shown) that may comprise titanium and/or tantalum nitride in some embodiments.

In one embodiment, the metallic fuse structure 424 may be disposed on a dielectric layer 434, that in one embodiment may comprise a dielectric layer disposed within and/or on a microelectronic device, such as an integrated circuit, for example. In one embodiment, the dielectric layer 434 may comprise a low k dielectric constant that may comprise a dielectric constant less than about 4. The metallic fuse structure 424 may further be disposed within and/or on a substrate 436. In one embodiment, the substrate may reside within and/or on a package structure (not shown), such as a ball grid array package, for example, that may be coupled with a motherboard, such as a printed circuit board (PCB) (not shown) for example.

Figure 4B:
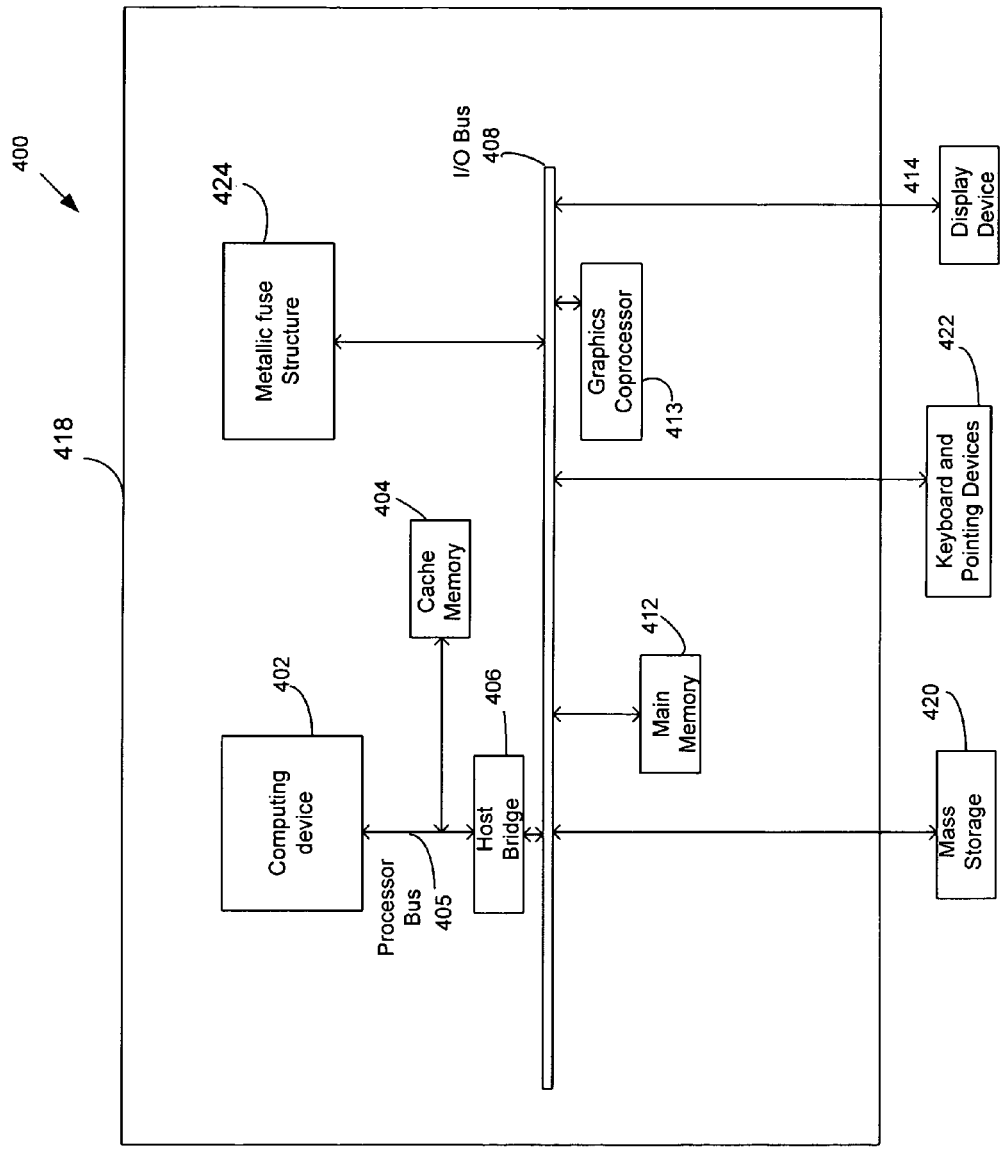

FIG. 4b is a diagram illustrating an exemplary system 400 that is capable of being operated with methods for fabricating a microelectronic structure, such as the metallic fuse structure 424 of FIG. 4a, for example. It will be understood that the present embodiment is but one of many possible systems in which the metallic fuse structures of the present invention may be used.

In the system 400, the metallic fuse structure 424 may be communicatively coupled to a printed circuit board (PCB) 418 by way of an I/O bus 408. The communicative coupling of the metallic fuse structure 424 may be established by physical means, such as through the use of a package and/or a socket connection to mount the metallic fuse structure 424 to the PCB 418 (for example by the use of a chip package, interposer and/or a land grid array socket). The metallic fuse structure 424 may also be communicatively coupled to the PCB 418 through various wireless means (for example, without the use of a physical connection to the PCB), as are well known in the art. In another embodiment, the metallic fuse structure 424 may be integrated as part of a monolithic semiconductor chip and communicated through die level interconnects.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the metallic fuse structure 424 may be a main memory 412. Examples of the main memory 412 may include, but are not limited to, static random access memory (SRAM) and/or dynamic random access memory (DRAM), and/or some other state preserving mediums. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming metallic fuse structures in accordance with embodiments of the present invention, whereas main memory 412 may be used to store on a shorter term basis the executable instructions of a method for a forming metallic fuse structures in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 402 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as integrated circuits, are well known in the art. Therefore, the Figures provided herein illustrate only portions of an exemplary microelectronic structure that pertains to the practice of the present invention. Thus the present invention is not limited to the structures described herein.

What is claimed is:

1. A metallic fuse comprising:
    a first surface of at least one via disposed on a first interconnect structure, wherein the at least one via comprises a barrier layer lining, and wherein the barrier layer lining is not disposed on the first interconnect structure adjacent the first surface of the at least one via;
    a second interconnect structure disposed on a second surface of the at least one via, wherein the barrier lined via is disposed between the first and second interconnect structures, and wherein the metallic fuse structure comprises the barrier lined via disposed between the first and second interconnect structures; and
    wherein at least one void is capable of forming within the first interconnect structure and the at least one via, upon application of a current to the metallic fuse.

2. The structure of claim 1 wherein the barrier layer lining comprises at least one of tantalum nitride, tantalum, titanium nitride and titanium, and wherein the barrier layer lining is disposed on the sidewalls and a bottom surface of the at least one via.

3. The structure of claim 1 wherein the metallic fuse comprises at least one of copper and aluminum, and wherein the metallic fuse is substantially free of silicide.

4. The structure of claim 1 wherein a width of the second interconnect structure is at least about 1.5 times wider than a width of the first interconnect structure.

5. The structure of claim 1 wherein a length of the at least one via is less than about 10 microns, and wherein the via comprises copper.

6. The structure of claim 1 wherein the first surface of the at least one via is attached to a first portion of the first interconnect structure and the second surface of the at least one via is attached to a first portion of the second interconnect structure.

7. The structure of claim 1 further comprising:
    a current source that is adapted to supply a sufficient amount of current to initiate forming at least one void in the metallic fuse;
    a bus communicatively coupled to the metallic fuse; and
    a DRAM communicatively coupled to the bus.

\* \* \* \* \*